US 9,887,191 B2

(12) United States Patent
Hata et al.

(10) Patent No.: US 9,887,191 B2
(45) Date of Patent: Feb. 6, 2018

(54) SEMICONDUCTOR DEVICE

(71) Applicant: TOYOTA JIDOSHA KABUSHIKI KAISHA, Toyota-shi, Aichi-ken (JP)

(72) Inventors: Hiroshi Hata, Toyota (JP); Satoru Kameyama, Toyota (JP); Shinya Iwasaki, Toyota (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 15/307,401

(22) PCT Filed: Aug. 3, 2015

(86) PCT No.: PCT/JP2015/071990
§ 371 (c)(1),
(2) Date: Oct. 28, 2016

(87) PCT Pub. No.: WO2016/051953
PCT Pub. Date: Apr. 7, 2016

(65) Prior Publication Data
US 2017/0263603 A1    Sep. 14, 2017

(30) Foreign Application Priority Data

Sep. 29, 2014    (JP) .................. 2014-198483

(51) Int. Cl.
*H01L 29/66*    (2006.01)
*H01L 27/06*    (2006.01)
*H01L 29/739*    (2006.01)
*H01L 29/861*    (2006.01)
*H01L 29/10*    (2006.01)

(52) U.S. Cl.
CPC ...... *H01L 27/0664* (2013.01); *H01L 29/1095* (2013.01); *H01L 29/7397* (2013.01); *H01L 29/8611* (2013.01)

(58) Field of Classification Search
CPC .................................. H01L 27/0664
USPC .......................................... 257/577
See application file for complete search history.

(56) References Cited

U.S. PATENT DOCUMENTS 8,058,693 B2 *  11/2011  Endo ............... H01L 29/7394
257/376
8,421,184 B2 *  4/2013  Koyama ........... H01L 29/7397
257/512
2009/0242931 A1   10/2009  Tsuzuki et al.

FOREIGN PATENT DOCUMENTS

JP    2009-267394 A    11/2009
JP    2013-138069 A    7/2013
JP    2015-118991 A    6/2015

* cited by examiner

*Primary Examiner* — Chandra Chaudhari
(74) *Attorney, Agent, or Firm* — Oliff PLC

(57) ABSTRACT

The re-combination center introduction region has re-combination centers introduced therein so that a density of the re-combination centers in the re-combination center introduction region is higher than a density of re-combination centers in a periphery of the re-combination center introduction region. The re-combination center introduction region continuously extends from the diode region to the peripheral region along a longitudinal direction of the diode region.

3 Claims, 7 Drawing Sheets

SEMICONDUCTOR DEVICE

TECHNICAL FIELD

The present disclosure relates to a semiconductor device.

BACKGROUND ART

Patent Literature 1 (Japanese Patent Application Publication No. 2013-138069) discloses a semiconductor device in which a semiconductor structure that operates as an IGBT (Insulated Gate Bipolar Transistor) and a semiconductor structure that operates as a diode are provided in a same semiconductor substrate. In this semiconductor device, the diode operates as a free wheeling diode and protects the IGBT. According to the semiconductor device having the IGBT and the diode provided in the same semiconductor substrate (referred to as an RC-IGBT (Reverse Conducting Insulated Gate Bipolar Transistor) in the present specification), the device can be made more compact in comparison with the conventional art which provides the IGBT and the diode in separate semiconductor substrates.

SUMMARY OF INVENTIONS

Technical Problem

In the RC-IGBT, to increase an withstand voltage of the diode, a p-type well region extending to a position deeper than an anode region is provided in a periphery of a diode region. In the RC-IGBT in which the p-type well region is provided to increase the withstand voltage, anomalies occur in the semiconductor device when switching speed of the IGBT is increased.

The present specification discloses an art in which the withstand voltage is increased by using the p-type well region, and at the same time, no anomalies are caused in the semiconductor device even if the switching speed of the IGBT is increased.

Solution to Technical Problem

The following fact has been revealed as a result of an examination for causes why the anomalies occur in a semiconductor device when the switching speed of an IGBT is increased under the situation where the semiconductor device has an increased withstand voltage by having a p-type well region in the peripheral region.

In the RC-IGBT, a reverse recovery current flows in the diode when the IGBT is turned on. It has been revealed that, if the p-type well region is provided in the peripheral region, there occurs a phenomenon where positive holes flow into a periphery of the p-type well region in a concentrated manner during the reverse recovery operation of the diode, and the excess concentration of the positive holes breaks the semiconductor device.

The present specification discloses an art to restrain the phenomenon where positive holes excessively concentrate in the periphery of the p-type well region during the reverse recovery operation of the diode. In the art disclosed herein, a re-combination center introduction region is provided at a location where positive holes excessively concentrate. If a region that has re-combination centers proactively introduced therein is provided, the positive holes re-combine with electrons and disappear, which can relieve the concentration of positive holes, and restrain the phenomenon where anomalies occur in the semiconductor device.

A semiconductor device disclosed by the present specification in which an IGBT and a diode are provided in a same semiconductor substrate comprises the semiconductor substrate, a front surface electrode provided on a front surface of the semiconductor substrate, and a back surface electrode provided on a back surface of the semiconductor substrate. In the semiconductor substrate, an active region, a peripheral region and a re-combination center introduction region are provided. An IGBT region and a diode region are juxtaposed in the active region in a plan view of the front surface of the semiconductor substrate. The diode region comprises an anode region electrically connected to the front surface electrode, a cathode region electrically connected to the back surface electrode, and a diode drift region positioned between the anode region and the cathode region. The peripheral region is positioned in a periphery of the active region in the plan view of the front surface of the semiconductor substrate. The peripheral region comprises a p-type well region extending from the front surface of the semiconductor substrate to a position deeper than the anode region and electrically connected to the front surface electrode. Further, the peripheral region comprises a peripheral drift region positioned on a back surface side of the well region and connected to the diode drift region. The re-combination center introduction region comprises re-combination centers introduced therein, so that a density of the re-combination centers in the re-combination center introduction region is higher than a density of re-combination centers in a periphery of the re-combination center introduction region. The re-combination center introduction region continuously extends from the diode drift region to the peripheral drift region along a longitudinal direction of the diode region.

In above-described RC-IGBT, while a positive voltage is being applied to the front surface electrode, a forward current flows in the diode. On the other hand, when a positive voltage is being applied to the back surface electrode and a voltage equal to or higher than a threshold value is being applied to a gate electrode of the IGBT, the IGBT is turned on. When the IGBT is turned on, the diode performs a reverse recovery operation. When the diode performs the reverse recovery operation, a large amount of holes are discharged from the diode drift region and the peripheral drift region to the front surface electrode. These holes pass through the re-combination center introduction region. In the re-combination center introduction region, a part of the large amount of holes re-combines with electrons and disappears. As such, holes which pass through the re-combination center introduction region thereby disappear, and hence the amount of holes discharged from the semiconductor substrate to the front surface electrode is reduced. The reverse recovery current of the diode is thereby restrained.

According to the above-described configuration, in particular, the re-combination center introduction region enters not only into the diode drift region, but also into the peripheral drift region positioned on the back surface side of the well region. The re-combination center introduction region is provided in a path through which holes pass through the well region from the peripheral drift region and are discharged to the front surface electrode, and hence a part of the holes is caused to disappear by the re-combination center introduction region, before entering the well region. Consequently, the amount of holes that pass through the well region from the semiconductor substrate and are discharged to the front surface electrode is reduced. The phenomenon where holes concentrate in the periphery of the well region is restrained, and the phenomenon where anomalies occur in the semiconductor device and the like is restrained.

DESCRIPTION OF EMBODIMENTS

First Embodiment

With reference to the attached drawings, embodiments will hereinafter be described. A semiconductor device according to the present embodiment is an RC-IGBT, and has a function as an IGBT and a function as an FWD (Free Wheeling Diode). The IGBT and the FWD are disposed in an anti-parallel state to constitute a reverse conducting-type semiconductor device.

Figure 1:
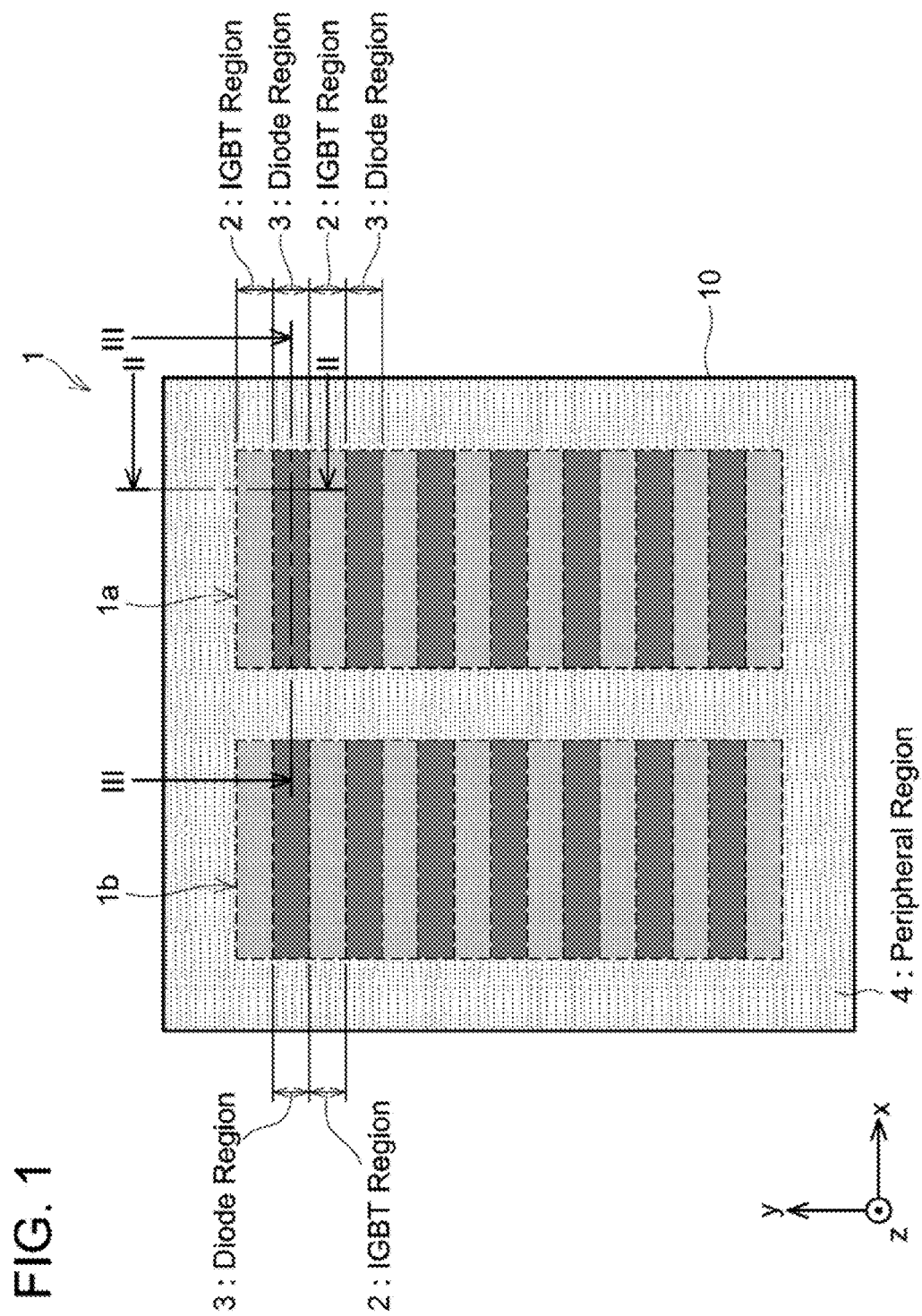
FIG. 1 is a plan view of a semiconductor device of an embodiment.
Figure 2:
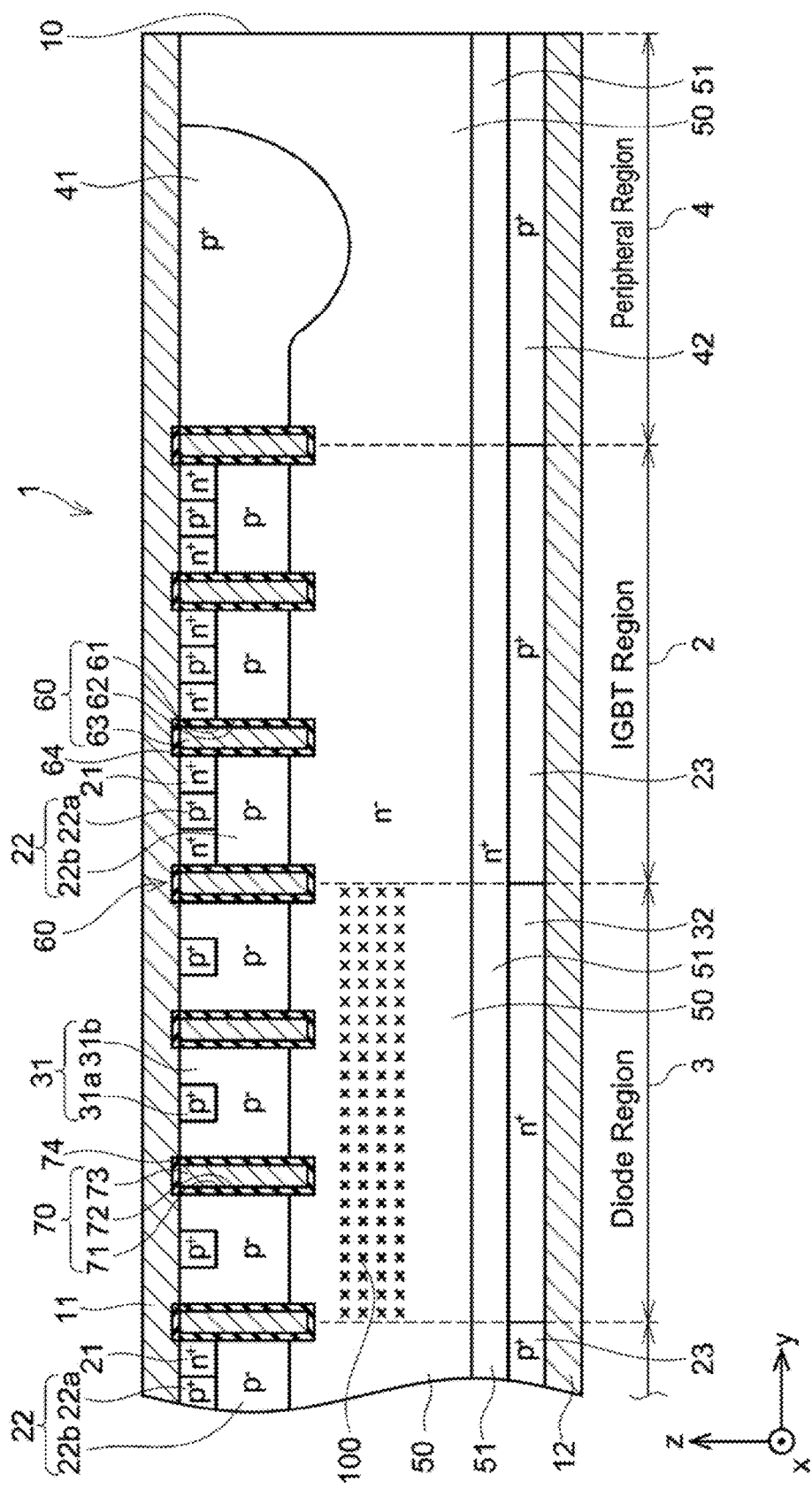
FIG. 2 is a cross-sectional view taken along II-II in FIG. 1.
Figure 3:
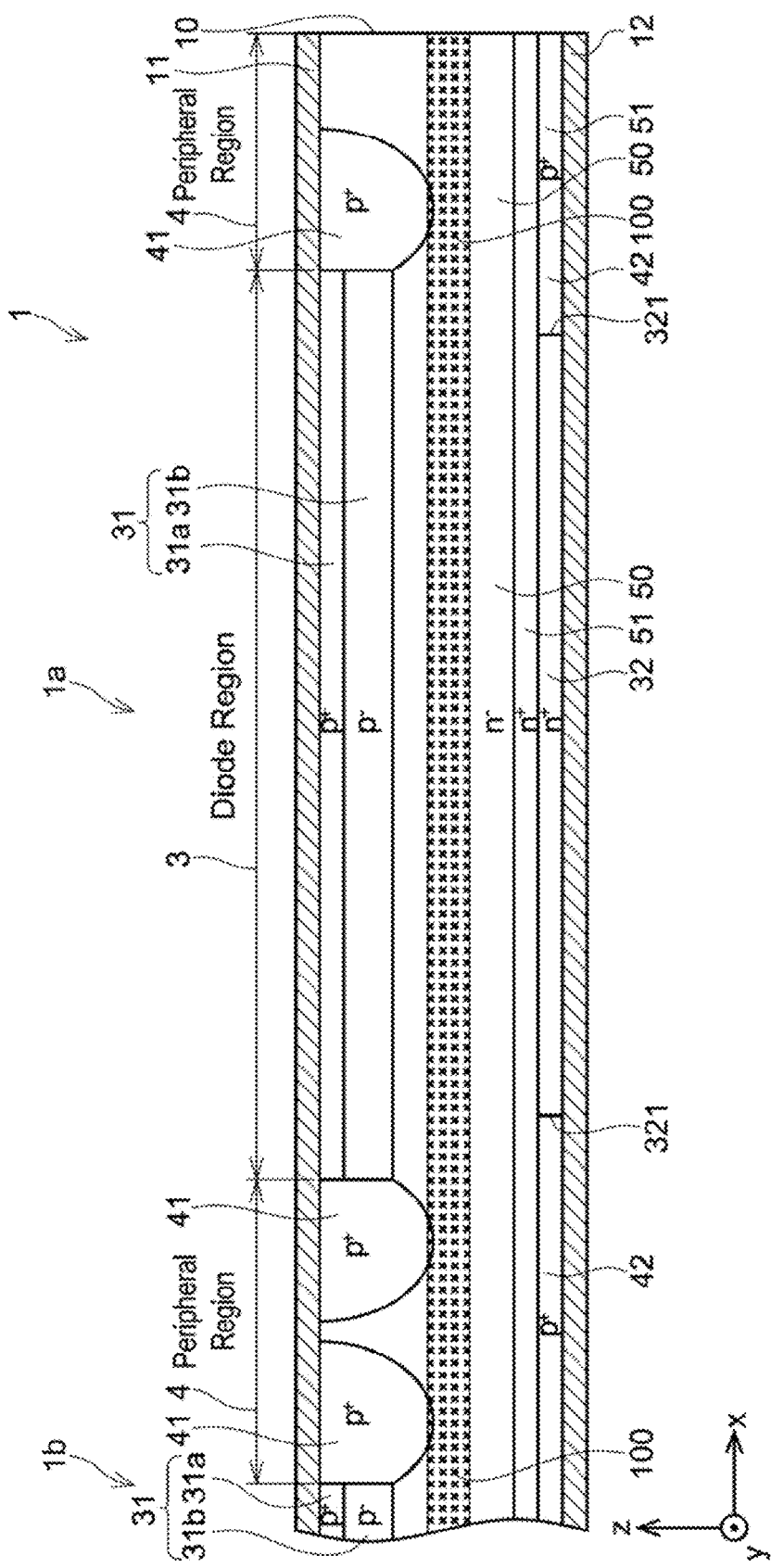
FIG. 3 is a cross-sectional view taken along in FIG. 1.

As shown in FIGS. 1 to 3, a semiconductor device 1 according to the embodiment comprises a semiconductor substrate 10, a front surface electrode 11 provided on a front surface of the semiconductor substrate 10, and a back surface electrode 12 provided on a back surface of the semiconductor substrate 10. Notably, in the present specification, an x direction, a y direction, and a z direction are defined as shown in the drawings. The z direction is a thickness direction of the semiconductor substrate 10. The y direction is a first direction orthogonal to the z direction. The x direction is a second direction orthogonal to the y direction and the z direction.

As shown in FIG. 1, the semiconductor substrate 10 is formed into an approximately rectangular shape in a plan view. The semiconductor substrate 10 is constituted of silicon (Si). In another example, the semiconductor substrate 10 may be constituted of silicon carbide (SiC), gallium nitride (GaN), or the like. Reference number 2 denotes a region where an IGBT structure is provided, and reference number 3 denotes a region where a diode structure is provided. Each of reference numbers 1a and 1b denotes an active region where IGBT regions 2 and diode regions 3 are provided. The semiconductor substrate 10 comprises the two active regions 1a and 1b. In each of the active regions 1a and 1b, the IGBT regions 2 and the diode regions 3 are alternately juxtaposed in the y direction (the first direction) in the plan view of the front surface of the semiconductor substrate 10. Each of the IGBT regions 2 and each of the diode regions 3 are long in the x direction (the second direction). The plurality of the IGBT regions 2 and the plurality of the diode regions 3 are arranged in a stripe-like manner in the plan view. In the plan view of the semiconductor substrate 10, a range positioned in a periphery of the active regions 1a and 1b is a peripheral region 4. The peripheral region 4 also extends in a spacing between the active regions 1a and 1b.

The x direction corresponds to a longitudinal direction of the IGBT regions 2 and the diode regions 3. The y direction corresponds to a short-side direction of the IGBT regions 2 and the diode regions 3. In the x direction, the diode regions 3 in the active region 1a and the diode regions 3 in the active region 1b are adjacent to each other with the peripheral region 4 intervening therebetween. Moreover, in the x direction, the IGBT regions 2 in the active region 1a and the IGBT regions 2 in the active region 1b are adjacent to each other with the peripheral region 4 intervening therebetween.

The peripheral region 4 is provided in the periphery of the plurality of the IGBT regions 2 and the plurality of the diode regions 3. The peripheral region 4 extends in the x direction and the y direction. The peripheral region 4 adjoins ends of the IGBT regions 2 and of the diode regions 3 in the longitudinal direction (the x direction). Portions of the peripheral region 4 that extend in the y direction adjoin the ends of the IGBT regions 2 and of the diode regions 3 in the longitudinal direction (the x direction). The peripheral region 4 is also provided between the diode regions 3 adjacent to each other in the x direction, and between the IGBT regions 2 adjacent to each other in the x direction. Moreover, portions of the peripheral region 4 that extend in the x direction adjoin the IGBT regions 2.

A semiconductor element is provided inside the semiconductor substrate 10. The semiconductor substrate 10 in each of the IGBT regions 2 has a vertical-type IGBT structure provided therein. The semiconductor substrate 10 in each of the diode regions 3 has a vertical-type diode structure provided therein. The IGBT and the diode are provided so as to adjoin each other to provide a reverse conducting-type semiconductor device.

As shown in FIG. 2, each IGBT region 2 comprises n-type emitter regions 21 provided on a front surface side of the semiconductor substrate 10, a p-type body region 22 provided on the front surface side of the semiconductor substrate 10, and a p-type collector region 23 provided on a back surface side of the semiconductor substrate 10. Moreover, each IGBT region 2 comprises an n-type drift region 50 and a buffer region 51 provided between the body region 22 and the collector region 23.

The emitter regions 21 and the body region 22 are exposed on the front surface of the semiconductor substrate 10, and connected to the front surface electrode 11. The emitter regions 21 are provided in an island-like manner in the range exposed on the front surface of the semiconductor substrate 10. The emitter regions 21 have a high impurity density. The emitter regions 21 are ohmic-connected to the front surface electrode 11, and electrically connected to the front surface electrode 11.

The body region 22 comprises body contact regions 22a and a low-density body region 22b. The body contact regions 22a are provided in an island-like manner in the range exposed on the front surface of the semiconductor substrate 10. Each of the body contact regions 22a is provided between two of the emitter regions 21. The body contact regions 22a have a high impurity density. The body contact regions 22a are ohmic-connected to the front surface electrode 11, and electrically connected to the front surface electrode 11.

The low-density body region 22b is provided under the emitter regions 21 and the body contact regions 22a. The low-density body region 22b has an impurity density lower than the impurity density of the body contact regions 22a.

The low-density body region 22b separates the emitter regions 21 from the drift region 50.

The drift region 50 in the IGBT region 2 (an IGBT drill region) is provided under the body region 22. The drift region 50 has a low impurity density. The buffer region 51 in the IGBT region 2 is provided under the drift region 50. The buffer region 51 has an impurity density higher than the impurity density of the drift region 50.

The collector region 23 is exposed on the back surface of the semiconductor substrate 10, and connected to the back surface electrode 12. The collector region 23 is provided under the buffer region 51. The collector region 23 has a high impurity density. The collector region 23 is ohmic-connected to the back surface electrode 12, and electrically connected to the back surface electrode 12.

Moreover, the IGBT region 2 comprises a plurality of trench gates 60. Each of the trench gates 60 comprises a trench 61, a gate insulating film 62 provided on an inner surface of the trench 61, and a gate electrode 63 provided inside the trench 61.

The plurality of the trench gates 60 are provided so as to be distanced from each other in the y direction. Each trench 61 is provided on the front surface side of the semiconductor substrate 10. The trench 61 extends from the front surface of the semiconductor substrate 10 in a depth direction (the z direction). The trench 61 penetrates the corresponding emitter regions 21 and the body region 22, and extends to an inside of the drill region 50. Each gate insulating film 62 covers the inner surface of the respective trench 61. The emitter regions 21 and the body region 22 are provided in a range that is in contact with the gate insulating films 62. The gate insulating films 62 are constituted of silicon dioxide (SiO2), for example. An inner side with respect to each gate insulating film 62 is filled with the gate electrode 63. The gate electrode 63 is insulated from the semiconductor substrate 10 by the gate insulating film 62. The gate electrode 63 is constituted of aluminum or polysilicon, for example.

On surfaces of the gate electrodes 63, an insulating film 64 is provided. The insulating film 64 is provided between the respective gate electrodes 63 and the front surface electrode 11, and insulates the gate electrodes 63 from the front surface electrode 11.

An IGBT is formed by the emitter regions 21, the body region 22, the drift region 50, the buffer region 51, the collector region 23, and the trench gates 60 in each IGBT region 2.

As shown in FIGS. 2 and 3, each diode region 3 comprises a p-type anode region 31 provided on the front surface side of the semiconductor substrate 10, and an n-type cathode region 32 provided on the back surface side of the semiconductor substrate 10. Moreover, the diode region 3 comprises the n-type drift region 50 and the n-type buffer region 51 that are provided between the anode region 31 and the cathode region 32.

The anode region 31 is exposed on the front surface of the semiconductor substrate 10, connected to the front surface electrode 11, and electrically connected to the front surface electrode 11. The anode region 31 comprises anode contact regions 31a and a low-density anode region 31b. The anode contact regions 31a are provided in an island-like manner in the range exposed on the front surface of the semiconductor substrate 10. The anode contact regions 31a have a high impurity density. The anode contact regions 31a are ohmic-connected to the front surface electrode 11.

The low-density anode region 31b is provided under and lateral to the anode contact regions 31a, and surrounds the anode contact regions 31a. The low-density anode region 31b has an impurity density lower than the impurity density of the anode contact regions 31a.

The drift region 50 in the diode region 3 (a diode drift region) is provided under the anode region 31. The drift region 50 has a low impurity density. The buffer region 51 in the diode region 3 is provided under the drift region 50. The buffer region 51 has an impurity density higher than the impurity density of the drift region 50.

The cathode region 32 is exposed on the back surface of the semiconductor substrate 10, and connected to the back surface electrode 12. The cathode region 32 is provided under the buffer region 51. The cathode region 32 has a high impurity density. The cathode region 32 is ohmic-connected to the back surface electrode 12, and electrically connected to the back surface electrode 12.

Moreover, the diode region 3 comprises a plurality of dummy trench gates 70. Each of the dummy trench gates 70 comprises a trench 71, and a gate insulating film 72 provided on an inner surface of the trench 71, and a gate electrode 73 provided inside the trench 71.

The plurality of the dummy trench gates 70 is provided so as to be distanced from each other in the y direction. Each trench 71 is provided on the front surface side of the semiconductor substrate 10. The trench 71 extends from the front surface of the semiconductor substrate 10 in the depth direction (the z direction). The trench 71 penetrates the anode region 31 and extends to the inside of the drift region 50. Each gate insulating film 72 covers the inner surface of the respective trench 71. The gate insulating film 72 is constituted of silicon dioxide (SiO2), for example. An inner side with respect to the gate insulating film 72 is filled with the gate electrode 73. Each gate electrode 73 is insulated from the semiconductor substrate 10 by the respective gate insulating film 72. The gate electrode 73 is constituted of aluminum or polysilicon, for example.

On surfaces of the gate electrodes 73, an insulating film 74 is provided. The insulating film 74 is provided between the respective gate electrodes 73 and the front surface electrode 11, and insulates the gate electrodes 73 from the front surface electrode 11.

A diode is formed by the anode region 31, the drift region 50, the buffer region 51, and the cathode region 32 in each diode region 3.

As shown in FIGS. 2 and 3, the peripheral region 4 comprises a p-type well region 41 provided on the front surface side of the semiconductor substrate 10 and a p-type back surface region 42 provided on the back surface side of the semiconductor substrate 10. Moreover, the peripheral region 4 comprises the n-type drill region 50 and the n-type buffer region 51 that are provided between the well region 41 and the back surface region 42.

The well region 41 is exposed on the front surface of the semiconductor substrate 10, and connected to the front surface electrode 11. The well region 41 has a high impurity density. The well region 41 is ohmic-connected to the front surface electrode 11. The well region 41 is provided up to a position deeper than the body region 22 in the IGBT region 2 and the anode region 31 in the diode region 3, in the depth direction (the z direction) of the semiconductor substrate 10. The well region 41 extends from the front surface of the semiconductor substrate 10 to a position deeper than the body region 22 and the anode region 31. The well region 41 has an impurity density higher than the impurity density of the anode region 31.

The drift region 50 in the peripheral region 4 (a peripheral drift region) is provided under and lateral to the well region 41, and surrounds the well region 41. The drift region 50 has a low impurity density. The buffer region 51 in the peripheral region 4 is provided under the drift region 50. The buffer region 51 has an impurity density higher than the impurity density of the drift region 50.

The back surface region 42 is exposed on the back surface of the semiconductor substrate 10, and connected to the back surface electrode 12. The back surface region 42 is provided under the buffer region 51. The back surface region 42 has a high impurity density. The back surface region 42 is ohmic-connected to the back surface electrode 12.

The front surface electrode 11 provided on the front surface of the semiconductor substrate 10 functions as an electrode for the emitter regions 21, the body region 22, the anode region 31, and the well region 41. The back surface electrode 12 provided on the back surface of the semiconductor substrate 10 functions as an electrode for the collector region 23, the cathode region 32, and the back surface region 42. Each of the front surface electrode 11 and the back surface electrode 12 is constituted of a conductive metal such as aluminum (Al) or copper (Cu), for example.

In the short-side direction (the y direction) of the IGBT regions 2 and the diode regions 3, the collector region 23 in each IGBT region 2 and the cathode region 32 in the adjacent diode region 3 adjoin each other. The collector region 23 and the cathode region 32 are juxtaposed in the y direction. Each boundary between the collector region 23 and the cathode region 32 corresponds to each boundary between the IGBT region 2 and the diode region 3. In other words, a region where the collector region 23 is exposed on the back surface of the semiconductor substrate 10 is the IGBT region 2, while a region where the cathode region 32 is exposed on the back surface of the semiconductor substrate 10 is the diode region 3. Notably, at each boundary between the IGBT region 2 and the diode region 3, the trench gate 60 is provided.

Moreover, in the short-side direction (the y direction) of the IGBT regions 2 and the diode regions 3, the peripheral region 4 is provided adjacent to the IGBT regions 2. In the short-side direction (the y direction) of each IGBT region 2, the well region 41 is provided adjacent to the trench gate 60 in the EGBT region 2. The well region 41 is provided at a position spaced apart from the trench gate 60. Notably, the short-side direction (the y direction) of the IGBT regions 2 and the diode regions 3 is a direction along which the IGBT regions 2 and the diode regions 3 are alternately juxtaposed.

The drift region 50 in the IGBT regions 2 (the IGBT drift region), the drift region 50 in the diode regions 3 (the diode drift region), and the drift region 50 in the peripheral region 4 (the peripheral drift region) have approximately the same impurity density, are connected to one another, and are a continuous semiconductor region. In other words, the drift region 50 is provided across the IGBT regions 2, the diode regions 3, and the peripheral region 4. Moreover, the buffer region 51 in the IGBT regions 2, the buffer region 51 in the diode regions 3, and the buffer region 51 in the peripheral region 4 have approximately the same impurity density, are connected to one another, and are a continuous semiconductor region. In other words, the buffer region 51 is provided across the IGBT regions 2, the diode regions 3, and the peripheral region 4.

In the drift region 50, a crystal defect region 100 (an example of a re-combination center introduction region) is provided. In the crystal defect region 100, a plurality of crystal defects are formed. The crystal defects in the crystal defect region 100 are formed by injecting charged particles such as helium ions into the semiconductor substrate 10. A crystal defect density in the crystal defect region 100 is higher than a crystal defect density in the drift region 50 in the periphery of the crystal defect region 100. The crystal defects in the crystal defect region 100 function as re-combination centers of carriers. Accordingly, a carrier lifetime in the crystal defect region 100 where the crystal defects are formed is shorter than a carrier lifetime in the drift region 50 in the periphery of the crystal defect region 100.

The crystal defect region 100 is provided in the drift region 50 in each diode region 3. The crystal defect region 100 is not provided in the drift region 50 in each IGBT region 2. Notably, in the cross section shown in FIG. 2, the crystal defect region 100 is not provided in the drift region 50 in the peripheral region 4, either. The crystal defect region 100 is provided in an entirety of each diode region 3 in the short-side direction (the y direction) of the diode region 3. The crystal defect region 100 extends from one end to the other end of each diode region 3 in the short-side direction (the y direction). The crystal defect region 100 does not enter into the IGBT regions 2 in the short-side direction (the y direction) of the diode region 3.

The crystal defect region 100 is provided in a part of the drift region 50 in the depth direction (the z direction) of the semiconductor substrate 10. A position where the crystal defect region 100 is provided in the depth direction (the z direction) of the semiconductor substrate 10 is not particularly limited, but the crystal defect region 100 is preferably provided at a position close to each anode region 31. The crystal defect region 100 is provided at a position apart from a lower end of the anode region 31. The crystal defect region 100 is provided at a position apart from an upper end of each cathode region 32. In other words, the crystal defect region 100 is provided in a part of the semiconductor substrate 10 situated between the anode region 31 and the cathode region 32. Moreover, the crystal defect region 100 is provided at a position apart from lower end of the trenches 71.

As shown in FIG. 3, the crystal defect region 100 is provided in the entirety of each diode region 3 in the longitudinal direction (the x direction) of the diode region 3. The crystal defect region 100 extends from one end to the other end of the diode region 3 in the longitudinal direction (the x direction). The crystal defect region 100 extends from the diode region 3 to the peripheral region 4 in the longitudinal direction (the x direction) of the diode region 3. The crystal defect region 100 continuously extends, along the longitudinal direction of the diode region 3, from the drift region 50 in the diode region 3 to the drift region 50 in the peripheral region 4. The crystal defect region 100 enters into the peripheral region 4 from the diode region 3.

In the longitudinal direction (the x direction) of the diode region 3, the anode region 31 in each diode region 3 and the well region 41 in the peripheral region 4 adjoin each other. The anode region 31 and the well region 41 are juxtaposed in the x direction. Each boundary between the anode region 31 and the well region 41 corresponds to each boundary between the diode region 3 and the peripheral region 4. In other words, a region where the anode region 31 is exposed on the front surface of the semiconductor substrate 10 is the diode region 3, while a region where the well region 41 is exposed on the front surface of the semiconductor substrate 10 is the peripheral region 4.

Moreover, in the longitudinal direction (the x direction) of the diode region 3, the cathode region 32 in each diode region 3 and the back surface region 42 in the peripheral region 4 adjoin each other. The cathode region 32 and the back surface region 42 are juxtaposed in the x direction. Each boundary between the cathode region 32 and the back surface region 42 is positioned in the diode region 3. Ends 321 of the cathode region 32 on a peripheral region side in the longitudinal direction (the x direction) of the diode region 3 (hereinafter "peripheral region side ends 321") are positioned in the diode region 3.

In the longitudinal direction (the x direction) of the diode region 3, the crystal defect region 100 enters the peripheral region 4 up to a position where the crystal defect region 100 overlaps the well region 41, in the plan view of the semiconductor substrate 10. In other words, the crystal defect region 100 is provided, so as to overlap both of the anode region 31 and the well region 41, in the plan view of the semiconductor substrate 10. The crystal defect region 100 continuously extends, in the longitudinal direction of the diode region 3, beyond the well region 41 and to a position on an outer periphery side of the well region 41. Moreover, in the longitudinal direction of the diode region 3, the crystal defect region 100 is continuously provided across a space between the active regions 1a and 1b which are next to each other. Moreover, the crystal defect region 100 is provided up to ends of the semiconductor substrate 10.

In the depth direction (the z direction) of the semiconductor substrate 10, an upper end portion of the crystal defect region 100 overlaps a lower end portion of the well region 41. The crystal defects are provided in the lower end portion of the well region 41. In another example, the crystal defect region 100 may be apart from the well region 41 in the depth direction of the semiconductor substrate 10.

Next, an operation of each IGBT will be described. In the above-described semiconductor device 1, when a voltage that makes the back surface electrode 12 positive is applied between the front surface electrode 11 and the back surface electrode 12, and an on potential (a potential equal to or higher than a potential necessary for a channel to be formed) is applied to the gate electrodes 63 in the trench gates 60, the IGBT is turned on. In other words, the application of on potential to the gate electrodes 63 causes a channel to be formed in the low-density body region 22b in a range that is in contact with the gate insulating films 62. Consequently, electrons flow from the front surface electrode 11 to the back surface electrode 12 via the emitter regions 21, the channel formed in the low-density body region 22b, the drift region 50, the buffer region 51, and the collector region 23. Moreover, holes flow from the back surface electrode 12 to the front surface electrode 11 via the collector region 23, the buffer region 51, the drift region 50, the low-density body region 22b, and the body contact regions 22a. In other words, a current flows from the back surface electrode 12 to the front surface electrode 11. When the potential applied to the gate electrodes 63 in the trench gates 60 is switched from on potential to off potential, the IGBT is turned off.

Next, an operation of each diode will be described. When a voltage that makes the front surface electrode 11 positive (i.e., a forward voltage) is applied between the front surface electrode 11 and the back surface electrode 12, the diode is turned on. A current thereby flows from the front surface electrode 11 to the back surface electrode 12 via the anode region 31, the drift region 50, and the cathode region 32.

While the diode is on, carriers (holes) move from the anode region 31 toward the cathode region 32 via the drift region 50. Moreover, there may be a case where a portion of the body region 22 in the IGBT region 2 that is close to the diode region 3, and a portion of the drift region 50 that is close to the diode region 3 operate as a parasitic diode. In this case, carriers (holes) injected from the body region 22 into the drift region 50 move toward the cathode region 32 through the drift region 50. As such, while the diode is on, carriers are accumulated in the drift region 50.

Next, a case where the voltage applied to the diode is switched from a forward voltage to a reverse voltage will be described. In other words, a case where a voltage that makes the back surface electrode 12 positive (i.e., a reverse voltage) is applied between the front surface electrode 11 and the back surface electrode 12 will be described. In that case, the diode performs a reverse recovery operation. In the reverse recovery operation, the holes accumulated in the drift region 50 when the forward voltage is applied are discharged to the front surface electrode 11, and electrons accumulated in the drift region 50 when the forward voltage is applied are discharged to the back surface electrode 12.

When the diode performs the reverse recovery operation, a part of a large amount of the holes that are discharged from the drift region 50 to the front surface electrode 11 flows to the front surface electrode 11 via the anode region 31. Moreover, since the well region 41 is provided at a position that adjoins the anode region 31 in the longitudinal direction of the diode region 3, a part of the large amount of the holes that are discharged from the drift region 50 to the front surface electrode 11 flows to the front surface electrode 11 via the well region 41.

In the present embodiment, the crystal defect region 100 is provided in the drift region 50, and hence when the diode performs the reverse recovery operation, the large amount of the holes that are discharged from the drift region 50 to the front surface electrode 11 pass through the crystal defect region 100 in the drift region 50. In the crystal defect region 100, each of crystal defects functions as a re-combination center of carriers, and hence a part of the large amount of the holes that pass through the crystal defect region 100 re-combines with electrons and disappears. As such, the existence of the crystal defect region 100 causes the holes to disappear, as a result of which the amount of the holes discharged from the drift region 50 to the front surface electrode 11 via the anode region 31 is reduced. A reverse recovery current generated when the diode performs the reverse recovery operation is thereby restrained.

Moreover, in the above-described semiconductor device 1, the crystal defect region 100 continuously extends, along the longitudinal direction of the diode region 3, from the drift region 50 in each diode region 3 to the drift region 50 in the peripheral region 4. The crystal defect region 100 then extends in the longitudinal direction of the diode region 3, and enters the peripheral region 4 up to a position where the crystal defect region 100 overlaps the well region 41. A range of the crystal defect region 100 is thereby enlarged such that the crystal defect region 100 and the well region 41 overlap in the depth direction of the semiconductor substrate 10. Consequently, the crystal defect region 100 also exists in a path along which holes are discharged from the drift region 50 to the front surface electrode 11 via the well region 41. Accordingly, the large amount of holes that flow from the drift region 50 into the well region 41 passes through the crystal defect region 100. The holes that flow from the drift region 50 into the well region 41 thereby disappear in the crystal defect region 100. Consequently, the amount of holes discharged from the drift region 50 to the front surface electrode 11 via the well region 41 is reduced. Therefore, the amount of holes that flow into the well region 41 when the diode performs a reverse recovery operation is reduced, a reverse recovery current is restrained, and recovery resistance is improved.

Notably, in the conventional art, the crystal defect region is not provided up to the peripheral region, and hence a large amount of holes that flow from the drift region into the well region do not pass through the crystal defect region. Since the holes do not pass through the crystal defect region, they do not disappear by re-combination, causing a large amount of holes to flow into the well region. In particular, there has been a case where a large amount of holes flow into a portion of the well region that is close to the diode region, in a concentrated manner. In contrast, in the semiconductor device 1 in the above-described embodiment, such a concentration of a current to the well region 41 is restrained.

As described above, in the semiconductor device 1 in the present embodiment, the crystal defect region 100 continuously extends from the diode region 3 to the peripheral region 4, and enters the peripheral, region 4 up to the position where the crystal defect region 100 overlaps the well region 41. Holes that flow from the drift region 50 into the well region 41 can thereby be caused to disappear by the crystal defect region 100 in the peripheral region 4, and the amount of holes can be reduced. Accordingly, a reverse recovery current can be restrained and recovery resistance can be improved. Moreover, since the concentration of a current to the well region 41 is restrained, even when the switching speed of the IGBT is increased, no anomalies occur in the semiconductor device.

One embodiment of the present invention has been explained above, however, specific aspects are not limited to the above embodiment. In the following explanation, the same reference signs used in the above explanation are used here for the same configuration to omit the explanation.

Second Embodiment

In the above-described embodiment, the semiconductor substrate 10 comprises the plurality of the IGBT regions 2 and the plurality of the diode regions 3. However, one IGBT region 2 and one diode region 3 may suffice. Moreover, in the above-described embodiment, the crystal defect region 100 extends to the position where the crystal defect region 100 overlaps the well region 41, in the plan view of the front surface of the semiconductor substrate 10. However, the crystal defect region 100 may not necessarily extend to the position where the crystal defect region 100 overlaps the well region 41, as long as the crystal defect region 100 enters the peripheral region 4 from the diode region 3, in the longitudinal direction of the diode region 3.

Third Embodiment

Figure 4:
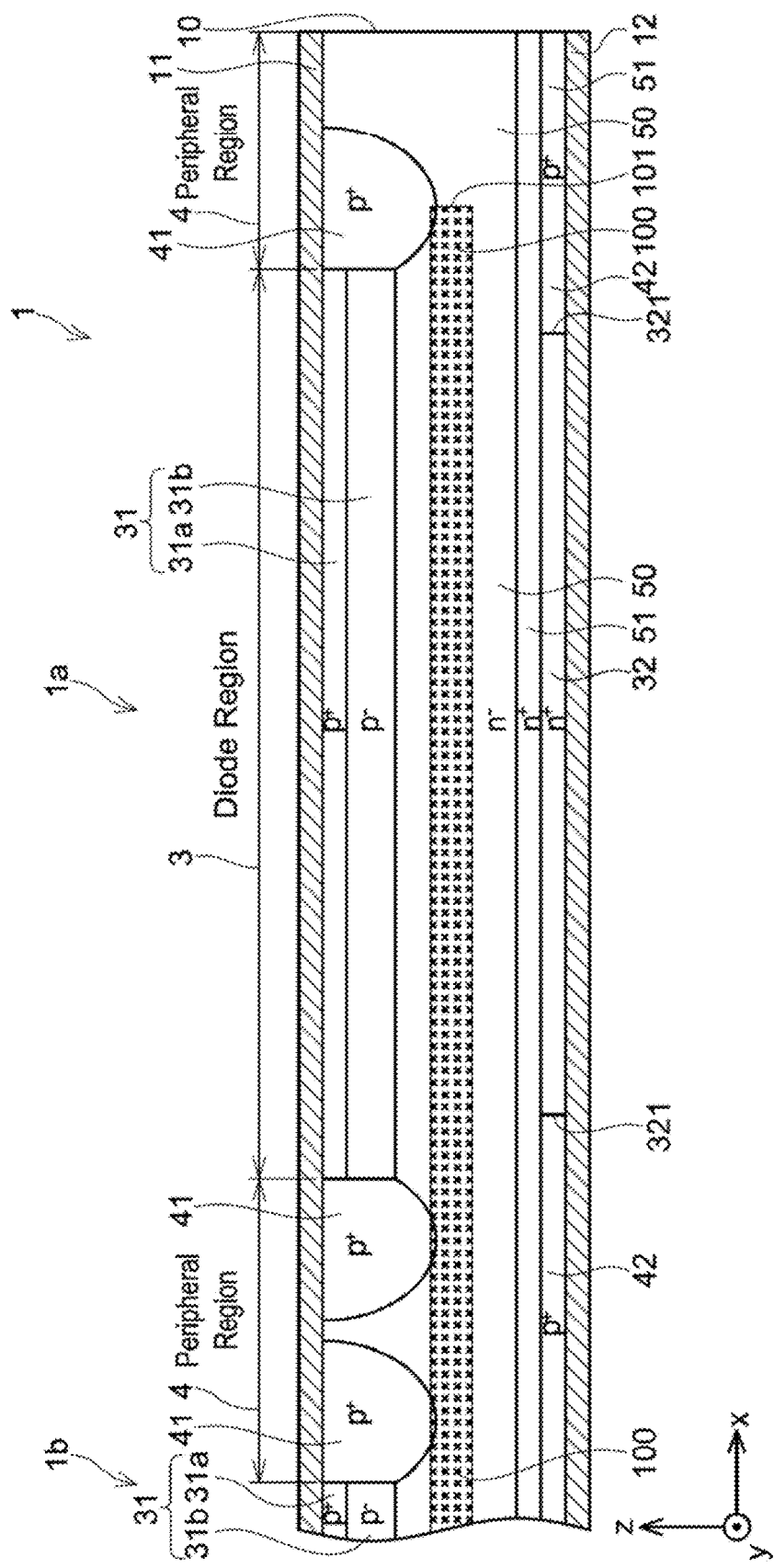
FIG. 4 is a cross-sectional view corresponding to FIG. 3 of a semiconductor device according to another embodiment.

In the above-described embodiment, the crystal defect region 100 is provided up to the end of the semiconductor substrate 10 in the longitudinal direction of the diode region 3. However, the crystal defect region 100 is not limited to this configuration. In another embodiment, as shown in FIG. 4, the crystal defect region 100 may not be provided up to the end of the semiconductor substrate 10, and one end 101 of the crystal defect region 100 on the peripheral region side (hereinafter "peripheral region side end 101") may be positioned below the well region 41. The peripheral region side end 101 of the crystal defect region 100 in the longitudinal direction (the x direction) of the diode region 3 is positioned in the peripheral region 4. The crystal defect region 100 is provided so as to protrude from the diode region 3 to the peripheral region 4. In this configuration as well, the crystal defect region 100 enters the peripheral region 4 up to the position where the crystal defect region 100 overlaps the well region 41.

Fourth Embodiment

Figure 5:
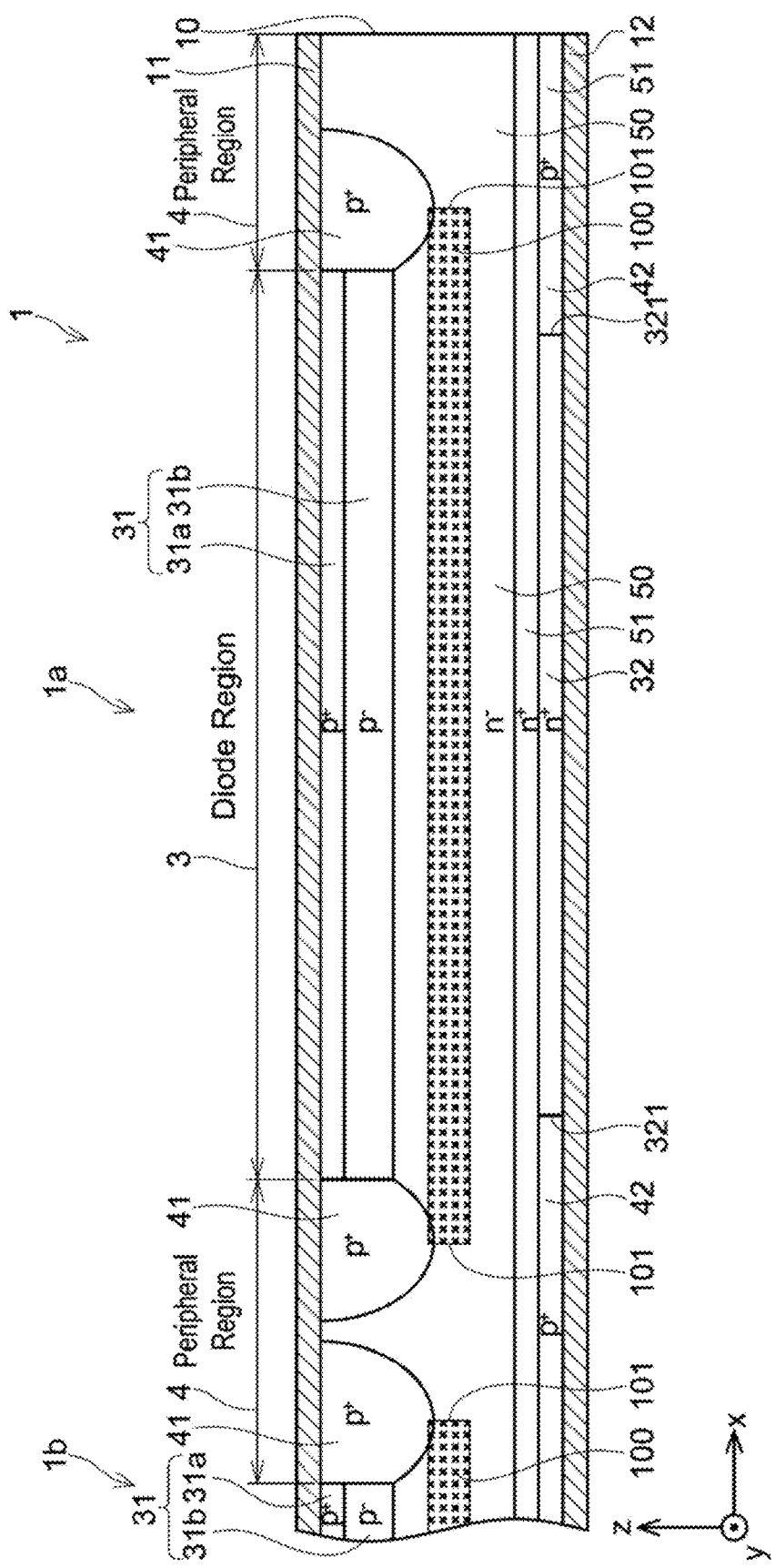
FIG. 5 is a cross-sectional view corresponding to FIG. 3 of a semiconductor device according to still another embodiment.

Moreover, in the above-described embodiment, in the longitudinal direction of the diode region 3, the crystal defect region 100 is continuously provided across the diode regions 3 adjacent to each other between the active regions 1*a* and 1*b*. However, the crystal defect region 100 is not limited to this configuration. In another embodiment, as shown in FIG. 5, the crystal defect region 100 may not be continuously provided across the adjacent diode regions 3, and the other peripheral region side end 101 of the crystal defect region 100 may be positioned below the well region 41. The peripheral region side ends 101 of the crystal defect region 100 in the longitudinal direction (the x direction) of the diode region 3 are positioned in the peripheral region 4. The crystal defect region 100 is provided so as to protrude from the diode region 3 to the peripheral region 4. In this configuration as well, the crystal defect region 100 enters the peripheral region 4 up to the position where the crystal defect region 100 overlaps the well region 41.

Figure 6:
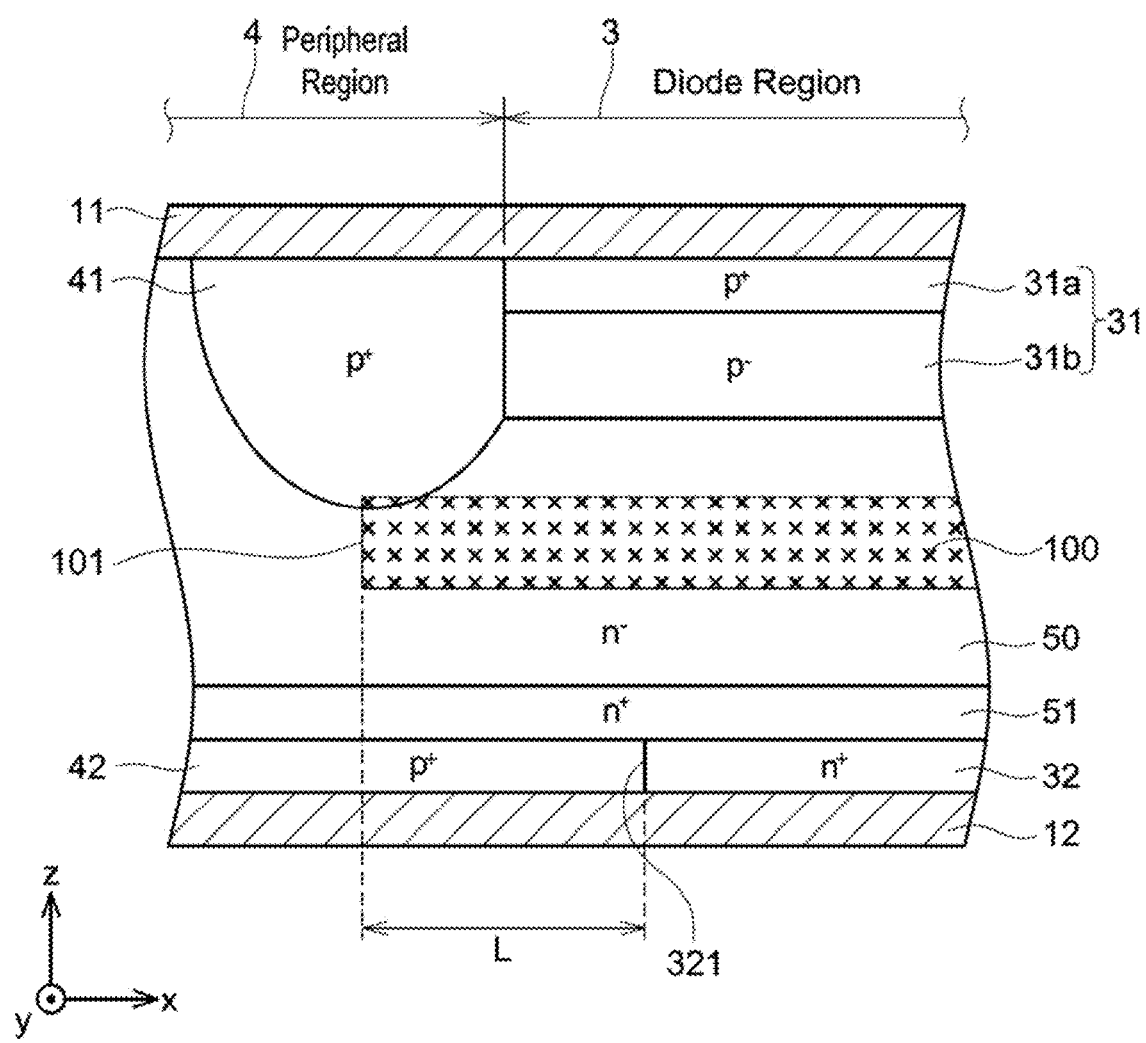
FIG. 6 is a cross-sectional view that shows a main part of the semiconductor device.

Since the configurations according to the third and fourth embodiments shown in FIGS. 4 and 5, respectively, have the crystal defect region 100 shorter than that in the configuration mentioned above and shown in FIG. 3, a leakage current due to the crystal defects is decreased. However, if the crystal defect region 100 is made excessively short, there may be a case where holes that move from the drift region 50 toward the well region 41 do not disappear and a large amount of holes flow into the well region 41 in a concentrated manner. Therefore, from a viewpoint of decreasing the leakage current due to crystal defects and improving recovery resistance, the crystal defect region 100 is preferably provided so as to have a predetermined length in the longitudinal direction of the diode region 3. More specifically, as shown in FIG. 6, in the longitudinal direction (the x direction) of the diode region 3, a distance L from the peripheral region side end 321 of the cathode region 32 in the diode region 3 to the peripheral region side end 101 of the crystal defect region 100 in the peripheral region 4 is preferably equal to or more than 120 µm, and more preferably equal to or more than 360 µm. In other words, the crystal defect region 100 enters the peripheral region 4 and extends such that the distance L between the peripheral region side end 321 of the cathode region 32 and the peripheral region side end 101 of the crystal defect region 100 is preferably equal to or more than 120 µm, and more preferably equal to or more than 360 µm.

Fifth Embodiment

In each of the above-described embodiments, the crystal defect region 100 is formed by injecting charged particles such as helium ions. Then, the crystal defect region 100 functions as a region where carriers are re-combined and disappear. However, the region where carriers are re-combined and disappear is not limited to the crystal defect region 100. In another embodiment, for example, impurities of a metallic element may be implanted into the drift region 50 to thereby introduce re-combination centers into the drift region 50. In the region where the re-combination centers are introduced into the drift region 50, carriers are re-combined and disappear. Such a region is referred to as a re-combination center introduction region. The crystal defect region 100 described in each of the above-described embodiments is one example of the re-combination center introduction region. The re-combination center introduction region is a region in which the re-combination centers are proactively introduced therein, and is a region that has a re-combination center density higher than that in the periphery of the re-combination center introduction region. If the re-combination center introduction region is proactively provided at a place where positive holes excessively concentrate, the positive holes re-combine with electrons and disappear in the re-combination centers, as a result of which the concentration of positive holes is relieved and the phenomenon where the semiconductor device is damaged can be restrained.

Test Example

By using an example, the art disclosed in the present specification will hereinafter be described in further details. In the example, a model of the semiconductor device shown in FIG. 6 was set and computer analyses were conducted to examine amount of holes in the semiconductor device. More specifically, the amount of holes in a portion close to the peripheral region side end 321 of the cathode region 32 was analyzed while the distance L from the peripheral region side end 321 of the cathode region 32 in the diode region 3 to the peripheral region side end 101 of the crystal defect region 100 in the peripheral region 4 was variously changed. The results are shown in FIG. 7.

Figure 7:
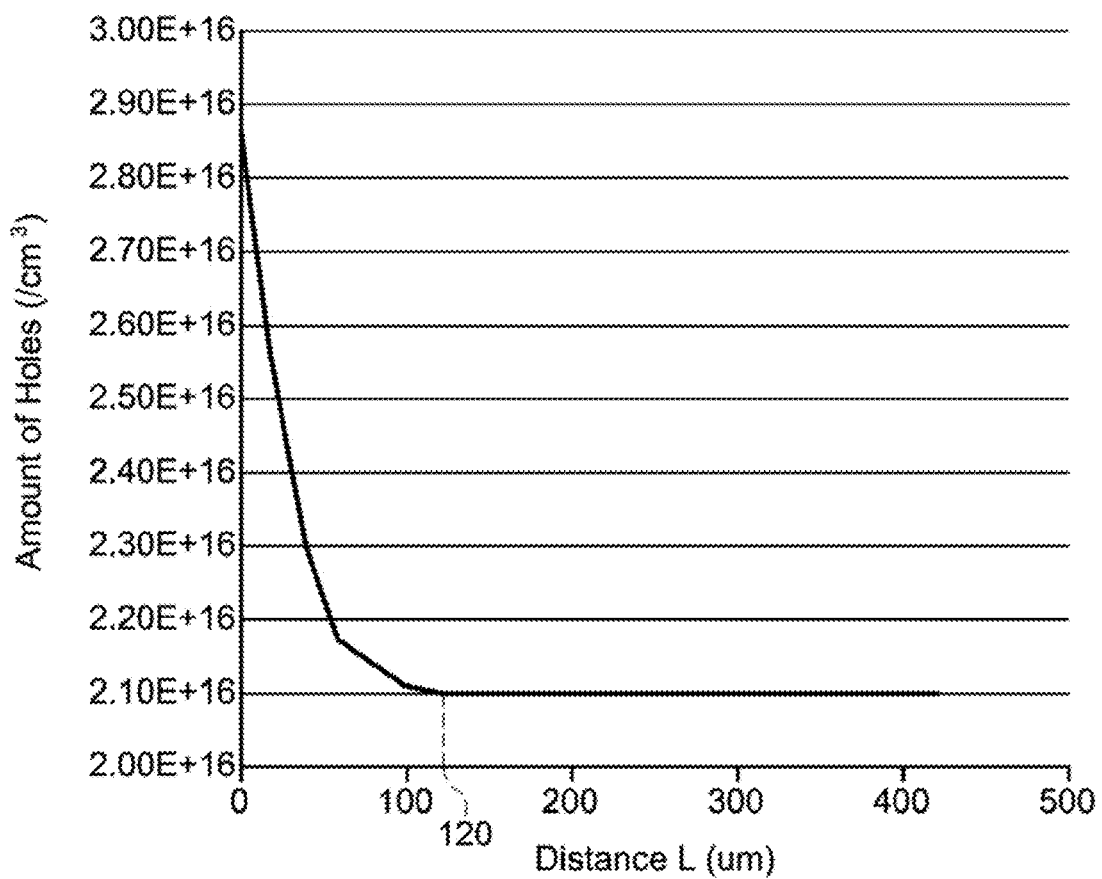
FIG. 7 is a diagram that shows a relation between a distance from an end of a cathode region on a peripheral region side to an end of a re-combination center introduction region on the peripheral region side, and amount of holes.

As shown in FIG. 7, in a range in which the distance L is 0 μm or more and 120 μm or less, the amount of holes decreases as the distance L increases. Moreover, in a range in which the distance L is 120 μm or more, the amount of holes does not change much even if the distance L increases. In other words, if the distance L is increased up to 120 μm, the amount of holes becomes approximately the same as the amount of holes in a case where the distance L is increased to exceed 120 μm. Accordingly, if the distance L is 120 μm, the distribution of holes is restrained as in the case where the distance L is longer than 120 μm.

From the above, it has been affirmed that the amount of holes is restrained by setting the distance L, which ranges from the peripheral region side end 321 of the cathode region 32 in the diode region 3 to the peripheral region side end 101 of the crystal defect region 100 in the peripheral region 4, to equal to or more than 120 μm. Consequently, it has also been affirmed that, if the distance L is set to equal to or more than 120 μm, the amount of holes that flow into the well region 41 is restrained, and recovery resistance is improved.

Some of the technical elements of the semiconductor device disclosed by the present specification will herein be listed. It should be noted that the respective technical elements are independent of one another, and are useful solely or in combinations.

In a semiconductor device disclosed herein as an example, the distance from the end of the cathode region on the peripheral region side to the end of the re-combination center introduction region on the peripheral region side may be equal to or more than 120 μm. If the above-described distance is equal to or more than 120 μm, a ratio of holes that re-combine with electrons and disappear before entering the well region is increased, and the degree of concentration of holes in the periphery of the well region is decreased.

In a semiconductor device disclosed herein as an example, the re-combination center introduction region may extend continuously from the diode drift region to an outer periphery side of the well region. The degree of concentration of holes is thereby decreased at all positions in the periphery of the well region.

In a semiconductor device disclosed herein as an example, the plurality of the IGBT regions and the plurality of the diode regions may be alternately juxtaposed in the active region in the plan view of the front surface of the semiconductor substrate. Further, the peripheral region may adjoin the IGBT region in a direction along which the IGBT regions and the diode regions are alternately juxtaposed. When observed along the first direction, the peripheral region is positioned on the outer periphery side of the IGBT region. In other words, the IGBT regions, the diode regions, and the peripheral region are arranged not in the order of the peripheral region, the diode region, the IGBT region, the diode region . . . , but in the order of the peripheral region, the IGBT region, the diode region, the diode region . . . .

Specific examples of the present invention have been described in detail, however, these are mere exemplary indications and thus do not limit the scope of the claims. The art described in the claims include modifications and variations of the specific examples presented above. Technical features described in the description and the drawings may technically be useful alone or in various combinations, and are not limited to the combinations as originally claimed. Further, the art described in the description and the drawings may concurrently achieve a plurality of aims, and technical significance thereof resides in achieving any one of such aims.

REFERENCE SIGNS LIST

1: Semiconductor device
2: IGBT region
3: Diode region
4: Peripheral region
10: Semiconductor substrate
11: Front surface electrode
12: Back surface electrode
21: Emitter region
22: Body region
22a: Body contact region
22b: Low-density body region
23: Collector region
31: Anode region
31a: Anode contact region
31b: Low-density anode region
32: Cathode region
41: Well region
42: Back surface region
50: Drift region
51: Buffer region
60: Trench gate
61: Trench
62: Gate insulating film
63: Gate electrode
64: Insulating film
70: Dummy trench gate
71: Trench
72: Gate insulating film
73: Gate electrode
74: Insulating film
100: Crystal defect region

The invention claimed is:

1. A semiconductor device having an IGBT and a diode provided in a same semiconductor substrate, the semiconductor device comprising:
   the semiconductor substrate;
   a front surface electrode provided on a front surface of the semiconductor substrate; and a back surface electrode provided on a back surface of the semiconductor substrate, wherein an active region, a peripheral region and a re-combination center introduction region are provided in the semiconductor substrate, an IGBT region and a diode region are juxtaposed in the active region in a plan view of the front surface of the semiconductor substrate, the diode region comprises: an anode region electrically connected to the front surface electrode; a cathode region electrically connected to the back surface electrode; and a diode drift region positioned between the anode region and the cathode region, the peripheral region is positioned in a periphery of the active region in the plan view of the front surface of the semiconductor substrate, and comprises: a p-type well region extending from the front surface of the semiconductor substrate to a position deeper than the anode region and electrically connected to the front surface electrode; and a peripheral drift region positioned on a back surface side of the well region and connected to the diode drift region, the re-combination center introduction region comprises re-combination centers introduced therein, so that a density of the re-combination centers in the re-combination center introduction region is higher than a density of re-combination centers in a periphery of the re-combination center introduction region, and the re-combination center introduction region continuously extends from the diode drift region to the peripheral drift region along a longitudinal direction of the diode region, and the re-combination center introduction region projects to the peripheral drift region from the diode drift region and does not extend to an end of the semiconductor substrate.

2. The semiconductor device according to claim 1 wherein the re-combination center introduction region extends continuously from the diode drift region to an outer periphery side of the well region.

3. The semiconductor device according to claim 1, wherein a plurality of the IGBT regions and a plurality of the diode regions are alternately juxtaposed in the active region in the plan view of the front surface of the semiconductor substrate, and the peripheral region adjoins the IGBT region in a direction along which the IGBT regions and the diode regions are alternately juxtaposed.

* * * * *